(12) United States Patent
Castle et al.

(10) Patent No.: US 9,498,823 B2
(45) Date of Patent: Nov. 22, 2016

(54) METAL CASTING APPARATUS, CAST WORK PIECE AND METHOD THEREFOR

(75) Inventors: Lea Kennard Castle, Vernon, CT (US); Steven J. Bullied, Pomfret Center, CT (US); Maria Arceo Herring, Mystic, CT (US)

(73) Assignee: United Technologies Corporation, Hartford, CT (US)

( * ) Notice: Subject to any disclaimer, the term of this patent is extended or adjusted under 35 U.S.C. 154(b) by 877 days.

(21) Appl. No.: 13/290,667

(22) Filed: Nov. 7, 2011

(65) Prior Publication Data

US 2013/0115476 A1 May 9, 2013

(51) Int. Cl.
*B22D 27/04* (2006.01)
*C30B 21/02* (2006.01)
*C30B 28/06* (2006.01)
*C30B 29/52* (2006.01)

(52) U.S. Cl.
CPC .............. *B22D 27/045* (2013.01); *C30B 21/02* (2013.01); *C30B 28/06* (2013.01); *C30B 29/52* (2013.01); *Y10T 428/12389* (2015.01)

(58) Field of Classification Search
CPC .................................................. B22D 27/045

USPC .................................. 164/122.1, 122.2, 361
See application file for complete search history.

(56) References Cited

U.S. PATENT DOCUMENTS

| | | | | |
|---|---|---|---|---|
| 3,494,709 | A | * | 2/1970 | Piearcey .................. 416/232 |
| 4,475,582 | A | | 10/1984 | Giamei et al. |
| 5,062,468 | A | * | 11/1991 | Monte et al. ............. 164/122.2 |
| 6,497,272 | B1 | | 12/2002 | Maslen |

FOREIGN PATENT DOCUMENTS

GB            2432133            5/2007

* cited by examiner

*Primary Examiner* — Kevin P Kerns
(74) *Attorney, Agent, or Firm* — Carlson, Gaskey & Olds, P.C.

(57) ABSTRACT

A metal casting apparatus includes a feeder for providing a molten metallic material. A mold includes a sprue and a component cavity. The sprue is arranged to receive the molten metallic material from the feeder and the component cavity is arranged to receive the molten metallic material from the sprue. A starter is arranged adjacent the component cavity and is operable to induce a first grain orientation upon solidification of the molten metallic material. The sprue includes an aborter that is arranged to induce a second grain orientation upon solidification of the molten metallic material.

14 Claims, 3 Drawing Sheets

METAL CASTING APPARATUS, CAST WORK PIECE AND METHOD THEREFOR

BACKGROUND

Metal casting, such as investment casting, involves feeding a molten metallic material from a pour cup through one or more sprues to fill one or more mold cavities. For directionally solidified castings, the mold is then slowly withdrawn from a heating unit to solidify the metallic material from the bottom of the mold. A grain starter block is arranged at the bottom of the mold to solidify the molten metallic material with a preferred grain orientation. As the molten metallic material cools, a solidification front moves from the bottom toward the top of the mold. The mold is then removed, leaving a cast metallic work piece. The sprues and excess gating are then cut off of the component.

SUMMARY

Disclosed is a metal casting apparatus that includes a feeder for providing a molten metallic material. A mold includes a sprue and a component cavity. The sprue is arranged to receive the molten metallic material from the feeder and the component cavity is arranged to receive a molten metallic material from the sprue. A starter is arranged adjacent the component cavity and is operable to induce a first grain orientation upon solidification of the molten metallic material. The sprue includes an aborter that is arranged to induce a second grain orientation upon solidification of the molten metallic material.

Also disclosed is a method for use in metal casting. The method includes feeding a molten metallic material into a mold to fill a component cavity and at least partially fill a sprue that is connected with the component cavity. The metallic material is then selectively solidified in the mold to induce a first grain orientation through the component cavity and a portion of the sprue and a second grain orientation in another portion of the sprue such that there is a microstructural discontinuity where the first grain orientation meets the second grain orientation in the sprue. The solidified metallic material forms a cast work piece that is then divided at the microstructural discontinuity.

Also disclosed is a cast work piece that includes a cast metal component section and a sprue section that is connected to the cast metal component section. The cast metal component section and a portion of the sprue section have a first grain orientation and another portion of the sprue has a second grain orientation such that there is a microstructural discontinuity where the first grain orientation meets the second grain orientation in the sprue.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION OF THE PREFERRED EMBODIMENT

Figure 1:
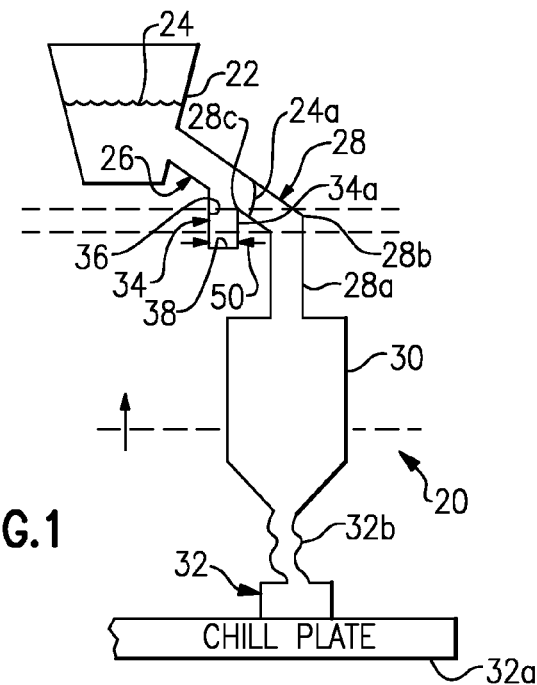
FIG. 1 illustrates an example top-feeding metal casting apparatus.

FIG. 1 illustrates selected portions of an example metal casting apparatus 20 for use with a metal casting method that will also be described herein. In casting metallic components, the sprues are typically cut off of the component after the casting process. As will be described herein, the metal casting apparatus 20 includes features that facilitate the removal of a sprue without cutting.

In the illustrated example, the metal casting apparatus 20 includes a feeder 22, such as a pourcup, for providing a molten metallic material 24 into a mold 26. The mold 26 includes a sprue 28 and a component cavity 30. The term "sprue" refers to any feeder passages, runners, risers or the like in the mold 26 that communicate molten metallic material and also refers to the solidified material in such passages after the casting process. As can be appreciated, the mold 26 may include multiple sprues 28 and mold cavities 30 for casting multiple components. The sprue 28 is arranged to receive the molten metallic material 24 from the feeder 22, and the component cavity 30 is arranged to receive the molten metallic material 24 from the sprue 28.

The metal casting apparatus 20 further includes a starter 32 that is arranged adjacent the component cavity 30. In this example, the starter 32 is arranged below the component cavity 30. The starter 32 is operable to induce a first grain orientation upon solidification of the molten metallic material 24. In this example, the starter 32 includes a chill plate 32a and a helical grain selector 32b for preferentially growing single crystal oriented grains.

The sprue 28 includes an aborter 34 that is arranged to induce a second, different grain orientation upon solidification of the molten metallic material 24. The term "grain orientation" refers to the substantial alignment of a crystallographic direction of the microstructural metallic grains along a common direction or axis. As an example, a crystallographic direction of the grains is aligned within a cone of about 10 degrees of the common direction or axis.

In the illustrated example, the sprue 28 includes a vertical section 28a and a transverse section 28b with regard to the vertical section 28a. The transverse section 28b is connected with the vertical section 28a to feed the molten metallic material 24 to the vertical section 28a. The transverse section 28b includes the aborter 34, which is a downwardly extending cavity 34a in the transverse section 28b.

As shown, the downwardly extending cavity 34a includes one or more sidewalls 36 that terminate at a bottom surface 38. In this example, extends lower than the junction point 28c between the aborter 34 and the transverse section 28b. The length of the aborter 34 can vary, as long as the molten metallic material 24 in the aborter 34 solidifies prior to the first grain orientation reaching the junction 28c. In the illustrated example, the bottom surface 38 is also located lower than the junction between the vertical section 28a and the transverse section 28b.

Figure 2:
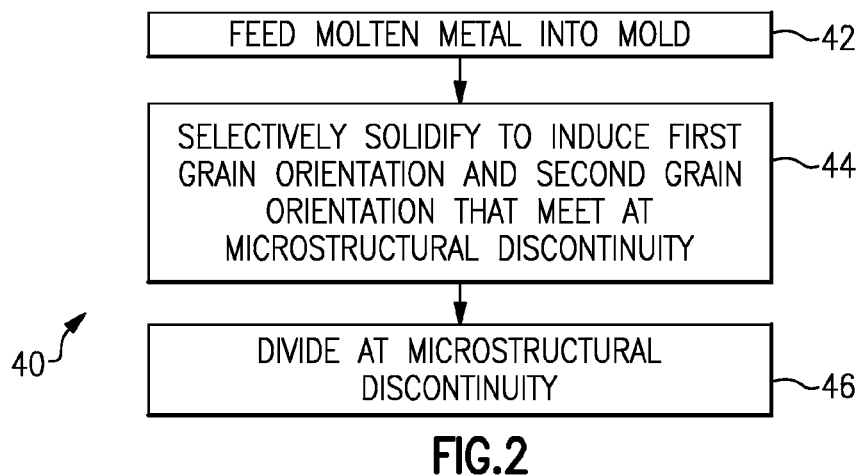
FIG. 2 illustrates a method for use in metal casting.

The operation of the metal casting apparatus 20 will now be described with reference to the method 40 shown in FIG. 2, with continuing reference to FIG. 1. The method 40 includes a feed step 42, a solidification step 44 and a dividing step 46. It is to be understood that other processing steps may be used in combination with the steps 42, 44 and 46.

The feed step 42 includes feeding the molten metallic material 24 into the mold 26 to fill the component cavity 30 and at least partially fill the sprue 28. The solidification step 44 includes selectively solidifying the metallic material to induce a first grain orientation through the component cavity 30 and a portion of the sprue 28 and a second grain orientation in another portion of the sprue 28 such that there is a microstructural discontinuity 24a where the first grain orientation meets the second grain orientation in the sprue 28. At step 46, the resulting cast work piece is divided at the microstructural discontinuity 24a to thereby separate at least a portion of the sprue 28 from the cast metal component formed in the component cavity 30.

In one example of the solidification step 44, the molten metallic material 24 is directionally solidified. For instance, the mold 26 is withdrawn from a heating unit such that the metallic material at the bottom of the mold 26 solidifies first and the metallic material at the top of the mold 26 is the last to solidify. As the molten metallic material 24 cools within the starter 32, the grain selector 32b preferentially solidifies the molten metallic material 24 with a preselected first grain orientation. As the mold 26 is further withdrawn from the heating unit, a solidification front, as represented by the sequence of dashed lines in FIG. 1, moves upwardly through the mold 26. As the mold 26 is further withdrawn from the heating unit, the solidification front moves up the sprue 28 toward the top of the mold 26.

In this example, at least the lower portion of the vertical section 28a of the sprue 28 begins to solidify before any other portion of the sprue 28. As the initial solidification front continues to move upwards in FIG. 1, a second solidification front initiates at the bottom surface 38 of the aborter 34. There is no grain selector at the bottom surface 38 and a secondary grain orientation therefore initiates. This second grain orientation is different than the first grain orientation and as its solidification front moves vertically upwards it eventually meets the initial solidification front of the first grain orientation at the microstructural discontinuity 24a.

The difference between the first and second grain orientation forms a relatively weak boundary, and in some cases a crack, at the microstructural discontinuity 24a. Upon removal of the cast work piece from the mold 26, the cast work piece is divided in the dividing step 46 at the microstructural discontinuity 24a. For example, upon full solidification of the metallic material, a crack may form at the microstructural discontinuity 24a to facilitate the separation. In another example, a force is applied to the sprue 28 to cause cracking and separation of a portion of the sprue 28 from the remaining portion of the sprue 28 and cast component along the microstructural discontinuity 24a. Thus, the microstructural discontinuity 24a facilitates removal of at least a portion of the sprue 28.

Figure 3:
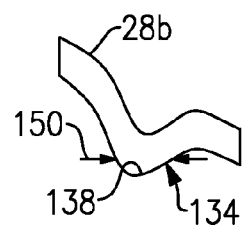
FIG. 3 illustrates an example aborter of a metal casting apparatus.
Figure 4:
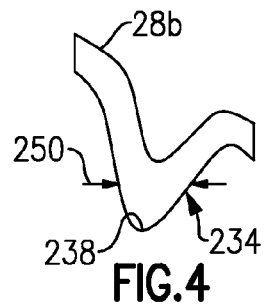
FIG. 4 illustrates another example aborter of a metal casting apparatus.

FIGS. 3 and 4 show, respectively, additional examples of aborters 134 and 234. In this disclosure, like reference numerals designate like elements where appropriate and reference numerals with the addition of one-hundred or multiples thereof designate modified elements that are understood to incorporate the same features and benefits of the corresponding elements. As shown in FIG. 1, the aborter 34 has a geometric cross-section 50. In the example shown, the geometric cross-section is cylindrical. In the examples shown in FIGS. 3 and 4, the aborters 134 and 234 have, respectively non-geometric cross sections 150 and 250. That is, the geometric cross-section 50 of the aborter 34 in FIG. 1 employs a simple cylindrical or polygonal shape and the non-geometric cross sections 150 and 250 of the respective aborters 134 and 234 are irregularly shaped.

Each aborter 134 and 234 also defines a respective bottom 138 and 238 that is located as described above with regard to junction 28c. Thus, the aborters 134 and 234 function similarly to the aborter 34 as described above.

Figure 5:
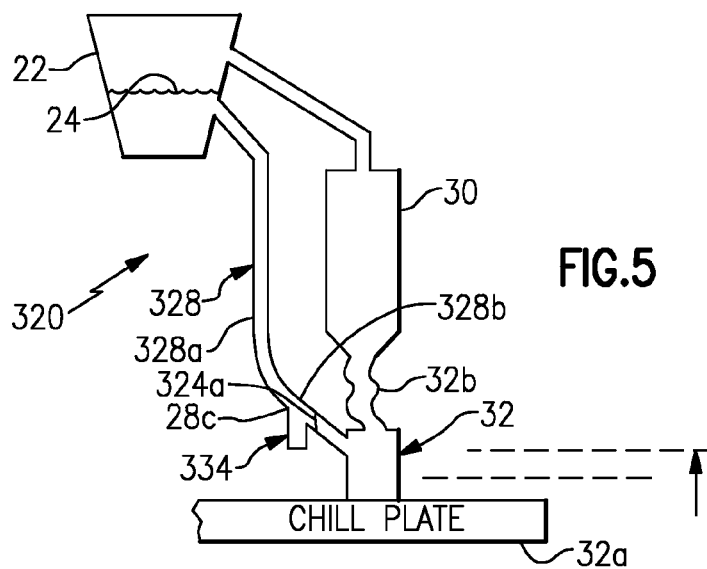
FIG. 5 illustrates a bottom-feeding metal casting apparatus.

FIG. 5 shows another example metal casting apparatus 320. In this example, the metal casting apparatus 320 is a bottom-feeding arrangement. Thus, a sprue 328 that feeds the molten metallic material from the feeder 22 is connected to the starter 32 such that the molten metallic material feeds through the starter 32 and upwardly from the bottom of the component cavity 30.

In this example, the sprue 328 also includes a vertical section 328a and a transverse section 328b. The transverse section 328b of the sprue 328 includes an aborter 334 that is shaped similar to the aborter 34 of FIG. 1 and operates similarly to induce a second grain orientation and microstructural discontinuity 324a where the second grain orientation meets the first grain orientation in the sprue 328.

Figure 6:
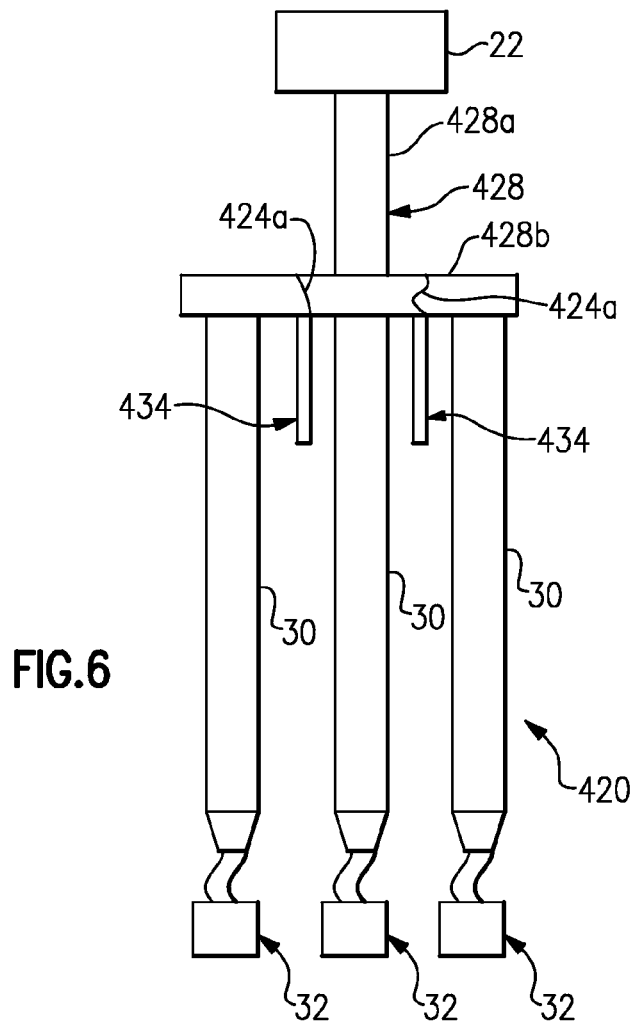
FIG. 6 illustrates a top-feeding metal casting apparatus with a common sprue.

FIG. 6 shows another example metal casting apparatus 420. In this example, a sprue 428 includes a vertical section 428a and a transverse section 428b that is arranged substantially horizontally to the vertical section 428a. The transverse section 428b feeds the molten metallic material from the feeder 22 into a plurality of component cavities 30. In this example, aborters 434 include downwardly extending cavities that are located between component cavities 30. Similar to as described above, the aborters 434 induce a second grain orientation which meets the first grain orientation in the sprue 428 at microstructural discontinuities 424a.

Figure 8:
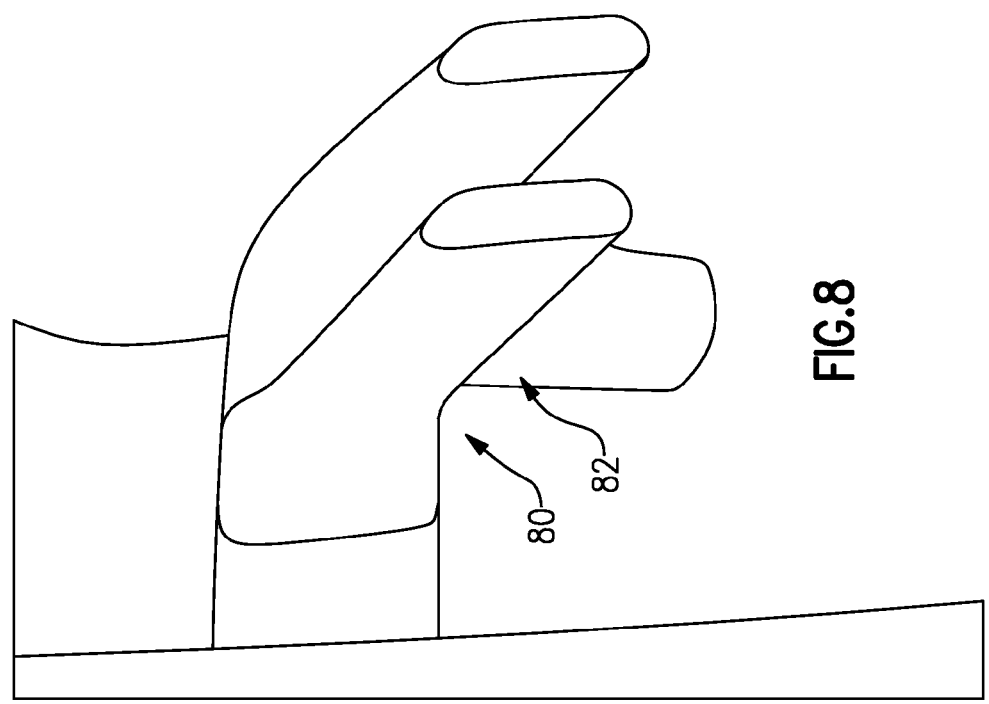
FIG. 8 illustrates a portion of a sprue that has been divided from a cast metal component at a microstructural discontinuity.
Figure 7:
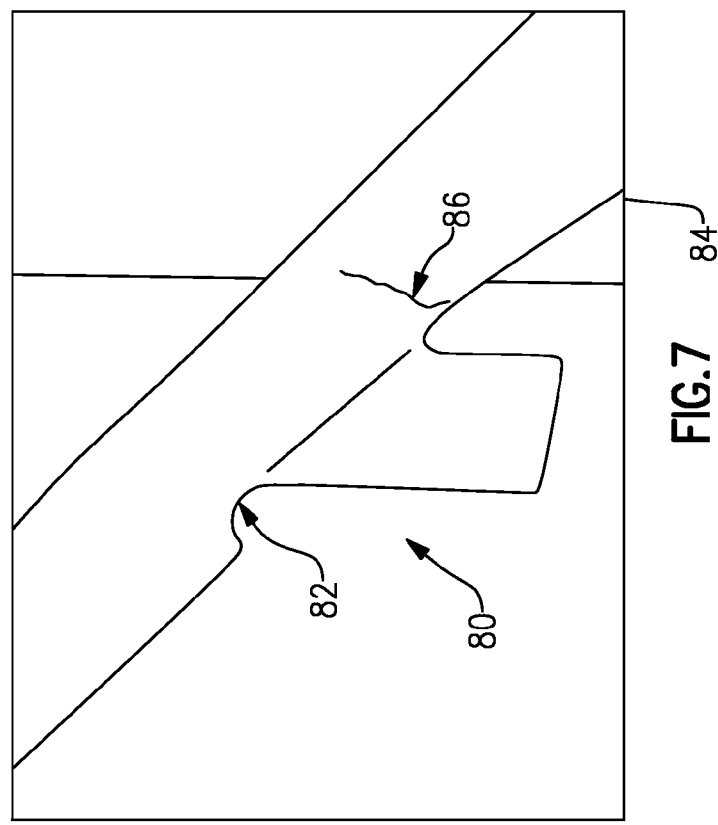
FIG. 7 illustrates a cast work piece and microstructural discontinuity.

FIGS. 7 and 8 show portions of a cast work piece 80 fabricated according to the method 40 in the metal casting apparatus 20, for example. As shown, the cast work piece 80 includes a sprue 82 connected to the cast metal component 84. The cast metal component 84 and a portion of the sprue have a first grain orientation and another portion of the sprue 82 has a second grain orientation such that there is a microstructural discontinuity, indicated by a crack 86 between the different grain orientation. As shown in FIG. 8, the cast work piece 80 is divided at the microstructural discontinuity of the crack 86 such that the sprue 82 is separated from the component 84.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A metal casting apparatus comprising:
   a feeder for providing a molten metallic material;
   a mold including a sprue and a component cavity, the sprue being arranged to receive the molten metallic material from the feeder and the component cavity being arranged to receive the molten metallic material from the sprue; and
   a starter arranged adjacent the component cavity and operable to induce a first grain orientation upon solidification of the molten metallic material,
   wherein the sprue includes an aborter arranged to induce a second grain orientation upon solidification of the molten metallic material, and
   wherein the feeder is a pourcup and a portion of the sprue extends between the aborter and the pourcup.

2. The metal casting apparatus as recited in claim 1, wherein the aborter comprises a downwardly extending cavity.

3. The metal casting apparatus as recited in claim 1, wherein the sprue includes a vertical section and a transverse section relative to the vertical section and the aborter comprises a downwardly extending cavity from the transverse section.

4. The metal casting apparatus as recited in claim 3, wherein the downwardly extending cavity includes a bottom and the bottom is located lower than any other portion of the transverse section.

5. The metal casting apparatus as recited in claim 3, wherein the downwardly extending cavity has a geometric cross section.

6. The metal casting apparatus as recited in claim 3, wherein the downwardly extending cavity has a non-geometric cross section.

7. The metal casting apparatus as recited in claim 3, wherein the transverse section is non-horizontally sloped.

8. The metal casting apparatus as recited in claim 3, wherein the transverse section is substantially horizontal.

9. The metal casting apparatus as recited in claim 1, wherein the sprue is arranged to feed the molten metallic material from the top of the component cavity.

10. The metal casting apparatus as recited in claim 1, wherein the sprue is arranged to feed the molten metallic material to the component cavity and also at least one additional component cavity, and the aborter is located between two of the component cavities.

11. The metal casting apparatus as recited in claim 1, wherein the sprue extends laterally from the pourcup.

12. A metal casting apparatus comprising:
    a feeder for providing a molten metallic material;
    a mold including a sprue and a component cavity, the sprue being arranged to receive the molten metallic material from the feeder and the component cavity being arranged to receive the molten metallic material from the sprue; and
    a starter arranged adjacent the component cavity and operable to induce a first grain orientation upon solidification of the molten metallic material,
    wherein the sprue includes an aborter arranged to induce a second grain orientation upon solidification of the molten metallic material, and
    wherein the sprue is arranged to feed the molten metallic material from the bottom of the component cavity.

13. A metal casting apparatus comprising:
    a feeder for providing a molten metallic material;
    a mold including a sprue and a component cavity, the sprue being arranged to receive the molten metallic material from the feeder and the component cavity being arranged to receive the molten metallic material from the sprue; and
    a starter arranged adjacent the component cavity and operable to induce a first grain orientation upon solidification of the molten metallic material,
    wherein the sprue includes an aborter arranged to induce a second grain orientation upon solidification of the molten metallic material, and
    wherein the aborter is arranged intermediate of a pair of open ends of the sprue.

14. A metal casting apparatus comprising:
    a pourcup for providing a molten metallic material;
    a mold including a sprue and a component cavity, the sprue being arranged to receive the molten metallic material from the pourcup and the component cavity being arranged to receive the molten metallic material from the sprue; and
    a starter arranged adjacent the component cavity and operable to induce a first grain orientation upon solidification of the molten metallic material,
    wherein the sprue includes a first sprue passage, a second sprue passage, and an aborter arranged to induce a second grain orientation upon solidification of the molten metallic material, the first sprue passage being arranged to receive the molten metallic material from the pourcup and communicate the molten metallic material to the aborter, the aborter being arranged to communicate the molten metallic material to the second sprue passage, and the second sprue passage being arranged to communicate the molten metallic material to the component cavity.

* * * * *